(12) United States Patent
Nishi (10) Patent No.: US 7,250,643 B2
(45) Date of Patent: Jul. 31, 2007

(54) SEMICONDUCTOR DEVICE AND METHOD OF MANUFACTURING THE SAME

(75) Inventor: Masahiro Nishi, Nakakoma-gun (JP)

(73) Assignee: Eudyna Devices Inc., Yamanashi (JP)

( * ) Notice: Subject to any disclaimer, the term of this patent is extended or adjusted under 35 U.S.C. 154(b) by 0 days.

(21) Appl. No.: 11/392,667

(22) Filed: Mar. 30, 2006

(65) Prior Publication Data
US 2006/0220150 A1 Oct. 5, 2006

(30) Foreign Application Priority Data
Mar. 31, 2005 (JP) .............................. 2005-105161

(51) Int. Cl.
H01L 29/739 (2006.01)
H01L 31/0328 (2006.01)
H01L 31/0336 (2006.01)
H01L 31/072 (2006.01)
H01L 31/109 (2006.01)

(52) U.S. Cl. ...................... 257/194; 257/195; 257/256; 257/263; 257/268; 257/280; 257/282; 257/281

(58) Field of Classification Search ........ 257/194–195, 257/256, 263–264, 268, 280, 281–282
See application file for complete search history.

(56) References Cited
U.S. PATENT DOCUMENTS 5,739,561 A * 4/1998 Wennekers .................. 257/257
5,742,082 A * 4/1998 Tehrani et al. ............... 257/280
2002/0140007 A1* 10/2002 Sakamoto .................... 257/276
2003/0183886 A1* 10/2003 Inoue et al. ................. 257/411
2005/0274977 A1* 12/2005 Saito et al. .................. 257/192
2006/0118823 A1* 6/2006 Parikh et al. ................ 257/194

FOREIGN PATENT DOCUMENTS

JP 2003-297854 A 10/2003

* cited by examiner

Primary Examiner—Ida M. Soward
(74) Attorney, Agent, or Firm—Westerman, Hattori, Daniels & Adrian, LLP.

(57) ABSTRACT

A semiconductor device includes: a gate electrode that is provided on a semiconductor layer; a source electrode and a drain electrode that are provided on the semiconductor layer so as to interpose the gate electrode; a source wall that extends from the source electrode to a point between the gate electrode and the drain electrode through the region above the gate electrode, the source wall having a joining portion in the extending region; and an electrode portion that is joined to the joining portion and has a region extending closer to the drain electrode than the joining portion.

12 Claims, 7 Drawing Sheets

SEMICONDUCTOR DEVICE AND METHOD OF MANUFACTURING THE SAME

BACKGROUND OF THE INVENTION

1. Field of the Invention

The present invention generally relates to a semiconductor device and a method of manufacturing the semiconductor device, and more particularly, to a semiconductor device for high-frequency amplification and a method of manufacturing the semiconductor device.

2. Description of the Related Art

Field-effect transistors have been known as semiconductor devices that are suitable for amplifications in high-frequency bands of microwaves, sub-millimeter waves, millimeter waves, and the likes. The factors that hinder high-frequency operations of those field-effect transistors include the source-drain parasitic capacitance and the drain-gate parasitic capacitance. To operate a field-effect transistor at a high speed, it is necessary to minimize those parasitic capacitances.

Japanese Unexamined Patent Publication No. 2003-297854 discloses a technique of forming a source wall that extends from the source electrode to a point between the gate electrode and the drain electrode through a region above the gate electrode. By this technique, the parasitic capacitance of a semiconductor device can be reduced.

By the technique (prior art) disclosed in Japanese Unexamined Patent Publication No. 2003-297854, the parasitic capacitance between the gate and the drain of a semiconductor device cannot be adequately reduced.

SUMMARY OF THE INVENTION

It is therefore an object of the present invention to provide a semiconductor device and a method of manufacturing the semiconductor device in which the above disadvantage is eliminated.

A more specific object of the present invention is to provide a semiconductor device that has lower parasitic capacitance Cgd between the gate and the drain so as to increase the voltage withstanding capability, and a method of manufacturing such a semiconductor device.

According to one aspect of the present invention, there is provided a semiconductor device including: a gate electrode that is provided on a semiconductor layer; a source electrode and a drain electrode that are provided on the semiconductor layer so as to interpose the gate electrode; a source wall that extends from the source electrode to a point between the gate electrode and the drain electrode through a region above the gate electrode, the source wall having a joining portion in the extending region; and an electrode portion that is joined to the joining portion and has a region extending closer to the drain electrode than the joining portion.

In the semiconductor device, the source wall extends from the source electrode to a point between the gate electrode and the drain electrode through the region above the gate electrode, and the electrode portion has a region located closer to the drain electrode than the joining portion to the drain electrode. Accordingly, the electric field concentration in the vicinities of the gate electrode and the drain electrode, and the parasitic capacitance between the gate and the drain can be reduced. Also, the voltage withstanding capability of the semiconductor device can be increased. Accordingly, electron trapping can be restrained. Thus, the possibility of current collapse can be reduced. Furthermore, since the electrode portion has a region extending toward the drain electrode, the strength of the semiconductor device can be increased.

In the semiconductor device, the distance between the drain electrode and an end of the source wall on the drain side may be longer than the distance between the electrode portion and the drain electrode. In this case, the capacitance between the source wall and the drain electrode can be reduced.

In the semiconductor device, the electrode portion may have a region extending from the joining portion toward the gate electrode. In this case, the voltage withstanding capability of the semiconductor device can be increased.

In the semiconductor device, a space may be provided below the source wall; and an insulating layer is provided below the electrode portion. In this case, the drain-source parasitic capacitance can be reduced.

According to another aspect of the present invention, there is provided a semiconductor device including: a gate electrode that is provided on a semiconductor layer; a source electrode and a drain electrode that are provided on the semiconductor layer so as to interpose the gate electrode; a source wall that extends from the source electrode to a point between the gate electrode and the drain electrode through a region above the gate electrode, the source wall having a joining portion in the extending region; and an electrode portion that is provided between the gate electrode and the drain electrode, and has a region extending closer to the source electrode than the joining portion, the electrode portion being joined to the joining portion.

In this semiconductor device of the present invention, the source wall extends from the source electrode to a point between the gate electrode and the drain electrode through the region above the gate electrode. Accordingly, the electric field concentration in the vicinities of the gate electrode and the drain electrode can be reduced. Thus, the parasitic capacitance between the gate and the drain can be reduced. Also, since the electrode portion has a region located closer to the source electrode than the joining portion to the source electrode, the voltage withstanding capability of the semiconductor device can be increased. Accordingly, electron trapping can be restrained, and the possibility of current collapse can be reduced. Also, the strength of the semiconductor device can be increased.

In the semiconductor device, the distance between a bottom portion of the electrode portion and a surface of the semiconductor layer may be 100 nm to 300 nm. In this case, gate leak current can be restrained.

In the semiconductor device, a bottom face of the electrode portion is located closer to the semiconductor layer than a top face of the gate electrode to the semiconductor layer. In this case, the gate-drain capacitance can be reduced, without adverse influence on drain current.

In the semiconductor device, at least a part of the source wall may be an air bridge.

According to another aspect of the present invention, there is provided a semiconductor device including: a gate electrode that is provided on a semiconductor layer; a source electrode and a drain electrode that are provided on the semiconductor layer so as to interpose the gate electrode; a source wall that extends from the source electrode at least to a point between the source electrode and the gate electrode, and has a joining portion in the extending region; and an electrode portion that is joined to the joining portion and connects a region between the source electrode and the gate electrode to a region between the gate electrode and the drain electrode.

In this semiconductor device of the present invention, the source wall extends from the source electrode to a point between the source electrode and the gate electrode, and the electrode portion has a region extending to a point between the gate electrode and the drain electrode through the region above the gate electrode. Accordingly, electric field concentration in the vicinities of the gate electrode and the drain electrode can be reduced, and the parasitic capacitance between the gate and the drain can be reduced. Also, the voltage withstanding capability of the semiconductor device can be increased. Accordingly, electron trapping can be restrained. Thus, the possibility of current collapse can be reduced. Also, since the electron portion has a region extending toward the drain electrode, the strength of the semiconductor device can be increased. Furthermore, as the distance between the source wall and the drain electrode is longer, the drain-source capacitance is reduced.

In the semiconductor device, the distance between the drain electrode and an end of the source wall on the drain side may be longer than the distance between the electrode portion and the drain electrode. In this case, the capacitance between the source wall and the drain electrode can be reduced.

In the semiconductor device, a space may be provided below the source wall; and an insulating layer may be provided below the electrode portion. In this case, the drain-source parasitic capacitance can be reduced.

In the semiconductor device, the electrode portion may be formed with a metal layer that covers a surface of the insulating layer covering the gate electrode.

According to another aspect of the present invention, preferably, there is provided a method of manufacturing a semiconductor device, including the steps of: forming a gate electrode, a source electrode, and a drain electrode on a semiconductor layer, the gate electrode being interposed between the source electrode and the drain electrode; forming an insulating layer that covers the gate electrode; forming an electrode portion on a portion of the insulating layer between the gate electrode and the drain electrode; forming an insulating layer that covers the gate electrode, the source electrode, and the electrode portion; forming openings to expose a top face of the source electrode and a top face of the electrode portion; and forming a source wall that extends through a region above the gate electrode, and is connected to the source electrode and the electrode portion.

By this method of manufacturing a semiconductor device, a gate electrode, a source electrode, and a drain electrode are formed on a semiconductor layer, with the gate electrode being interposed between the source electrode and the drain electrode. An insulting film to cover the gate electrode is formed, and an electrode portion is formed on a portion of the insulating layer located between the gate electrode and the drain electrode. An insulating layer to cover the gate electrode, the source electrode, and the electrode portion is then formed. Openings are also formed so as to expose the top face of the source electrode and the top face of the electrode portion. A source wall that extends through the region above the gate electrode and is connected to the source electrode and the electrode portion is formed.

In the semiconductor device manufactured by this method, the source wall extends from the source electrode to a point between the gate electrode and the drain electrode through the region above the gate electrode, and the electrode portion is provided between the drain electrode and the gate electrode. Accordingly, electric field concentration in the vicinities of the gate electrode and the drain electrode is reduced, and the parasitic capacitance between the gate and the drain is reduced. Also, the voltage withstanding capability can be increased. Accordingly, electron trapping can be restrained, and the possibility of current collapse can be reduced.

In the method of manufacturing a semiconductor device, the step of forming openings may be carried out by performing etching; and the etching may be performed, with the electrode portion being used as an etching stopper. In this case, etching can be prevented from reaching the semiconductor layer, even though the etching time is not adjusted.

In the method of manufacturing a semiconductor device, the step of forming an electrode portion may include forming the electrode portion that extends closer to the drain electrode than the opening for the electrode portion to the drain electrode. In this case, the line of electric force between the gate and the drain is cut off. Accordingly, the gate-drain capacitance is reduced.

In the method of manufacturing a semiconductor device, the step of forming a source wall may includes forming a seed metal for a plating to link the source electrode and the drain electrode, forming the plating on the seed metal, and dividing the plating, with the electrode portion being used as an etching stopper. In this case, etching can be prevented from reaching the semiconductor layer, even though the etching time is not adjusted.

According to another aspect of the present invention, preferably, there is provided a method of manufacturing a semiconductor device, including the steps of: forming a gate electrode, a source electrode, and a drain electrode on a semiconductor layer, the gate electrode being interposed between the source electrode and the drain electrode; forming an insulating layer that covers the gate electrode; forming an electrode portion on the insulating layer, extending from the gate electrode or a region closer to the source electrode than the gate electrode, to a region between the gate electrode and the drain electrode; forming an insulating layer that covers the gate electrode, the source electrode, and the electrode portion; forming openings to expose a top face of the source electrode and a top face of the gate electrode on the electrode portion or a top face of the electrode portion located closer to the source electrode than the gate electrode; and forming a source wall that has a region extending to a point between the source electrode and the gate electrode, and is connected to the electrode portion and the source electrode.

By this method of manufacturing a semiconductor device, a gate electrode, a source electrode, and a drain electrode are formed on a semiconductor layer, with the gate electrode being interposed between the source electrode and the drain electrode. An insulting film to cover the gate electrode is formed, and an electrode portion is formed on the insulating layer. The electrode portion extends from the gate electrode or a region located closer to the source electrode than the gate electrode to the source electrode, to a region between the gate electrode and the drain electrode. An insulating layer to cover the gate electrode, the source electrode, and the electrode portion is then formed. Openings are also formed so as to expose the top face of the source electrode and the top face of the gate electrode on the electrode portion or the top face of the electrode portion located closer to the source electrode than the gate electrode. A source wall that has a region extending to a point between the source electrode and the gate electrode and is connected to the electron portion and the source electrode is formed.

In the semiconductor device manufactured by this method, the source wall extends from the source electrode to a point between the gate electrode and the drain electrode, and the electrode portion has a region extending to a point between the gate electrode and the drain electrode through the region above the gate electrode. Accordingly, electric field concentration in the vicinities of the gate electrode and the drain electrode is reduced, and the parasitic capacitance between the gate and the drain is reduced. Also, the voltage withstanding capability of the semiconductor device can be increased. Accordingly, electron trapping can be restrained, and the possibility of current collapse can be reduced. Furthermore, since the electrode portion has a region extending toward the drain electrode, the strength of the semiconductor device is increased. Also, as the distance between the source wall and the drain electrode is longer, the drain-source capacitance is reduced.

In the method of manufacturing a semiconductor device, the step of forming an electrode portion may include forming the electrode portion that extends closer to the drain electrode than the opening for the electrode portion to the drain electrode. In this case, the line of electric force between the gate and the drain is cut off. Accordingly, the gate-drain capacitance is reduced.

In the method of manufacturing a semiconductor device, the step of forming an electrode portion may be carried out by vacuum vapor deposition or sputtering. In this case, the electrode portion can be made thinner.

In the method of manufacturing a semiconductor device, the step of forming a source wall may includes forming a seed metal for a plating to link the source electrode and the drain electrode, forming the plating on the seed metal, and dividing the plating, with the electrode portion being used as an etching stopper. In this case, etching can be prevented from reaching the semiconductor layer, even though the etching time is not adjusted.

According to another aspect of the present invention, preferably, there is provided a method of manufacturing a semiconductor device, including the steps of: forming an insulating layer that covers a source electrode and a drain electrode on a semiconductor layer; removing the insulating layer from a portion on the semiconductor layer between the source electrode and the drain electrode; simultaneously forming a gate electrode that is located at the portion on the semiconductor layer from which the insulating layer is removed, and an electrode portion that is located at a portion on the insulating layer between the gate electrode and the drain electrode; forming an insulating layer that covers the gate electrode, the source electrode, and the electrode portion; forming openings to expose a top face of the source electrode and a top face of the electrode portion; and forming a source wall that extends through a region above the gate electrode, and is connected to the source electrode and the electrode portion.

By this method of manufacturing a semiconductor device, an insulating layer to cover a source electrode and a drain electrode on a semiconductor layer is formed, and the insulating layer is removed from a portion on the semiconductor layer between the source electrode and the drain electrode. A gate electrode to be located at the portion on the semiconductor layer from which the insulating layer has been removed, and an electrode portion to be located at a portion on the insulating layer between the gate electrode and the drain electrode, are formed at the same time. An insulating layer to cover the gate electrode, the source electrode, and the electrode portion is then formed. Openings are then formed to expose the top face of the source electrode and the top face of the electrode portion. A source wall that extends through the region above the gate electrode and is to be connected to the source electrode and the electrode portion is formed.

Since the gate electrode and the electrode portion are formed in the same step by this method, the production process can be simplified, and the production cost can be lowered. In the semiconductor device manufactured by this method, the source wall extends from the source electrode to a point between the gate electrode and the drain electrode through the region above the gate electrode, and the electrode portion is located between the drain electrode and the gate electrode. Accordingly, electric field concentration in the vicinities of the gate electrode and the drain electrode is reduced, and the parasitic capacitance between the gate and the drain is lowered. Also, the voltage withstanding capability can be increased. Accordingly, electron trapping can be restrained, and the possibility of current collapse can be reduced.

In the method of manufacturing a semiconductor device, the step of forming openings may be carried out by performing etching; and the etching may be performed, with the electrode portion being used as an etching stopper. In this case, etching can be prevented from reaching the semiconductor layer, even though the etching time is not adjusted.

In the method of manufacturing a semiconductor device, the step of forming an electrode portion may include forming the electrode portion that extends closer to the drain electrode than the opening for the electrode portion to the drain electrode. In this case, the line of electric force between the gate and the drain is cut off. Accordingly, the gate-drain capacitance is reduced.

In the method of manufacturing a semiconductor device, the step of forming a source wall may includes forming a seed metal for a plating to link the source electrode and the drain electrode, forming the plating on the seed metal, and dividing the plating, with the electrode portion being used as an etching stopper. In this case, etching can be prevented from reaching the semiconductor layer, even though the etching time is not adjusted.

In accordance with the present invention, the parasitic capacitance between the gate and the drain can be reduced. Also, the possibility of current collapse can be reduced, and the voltage withstanding capability can be increased. Further, the strength of each semiconductor device can be increased.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of preferred embodiments of the present invention.

First Embodiment

Figure 1:
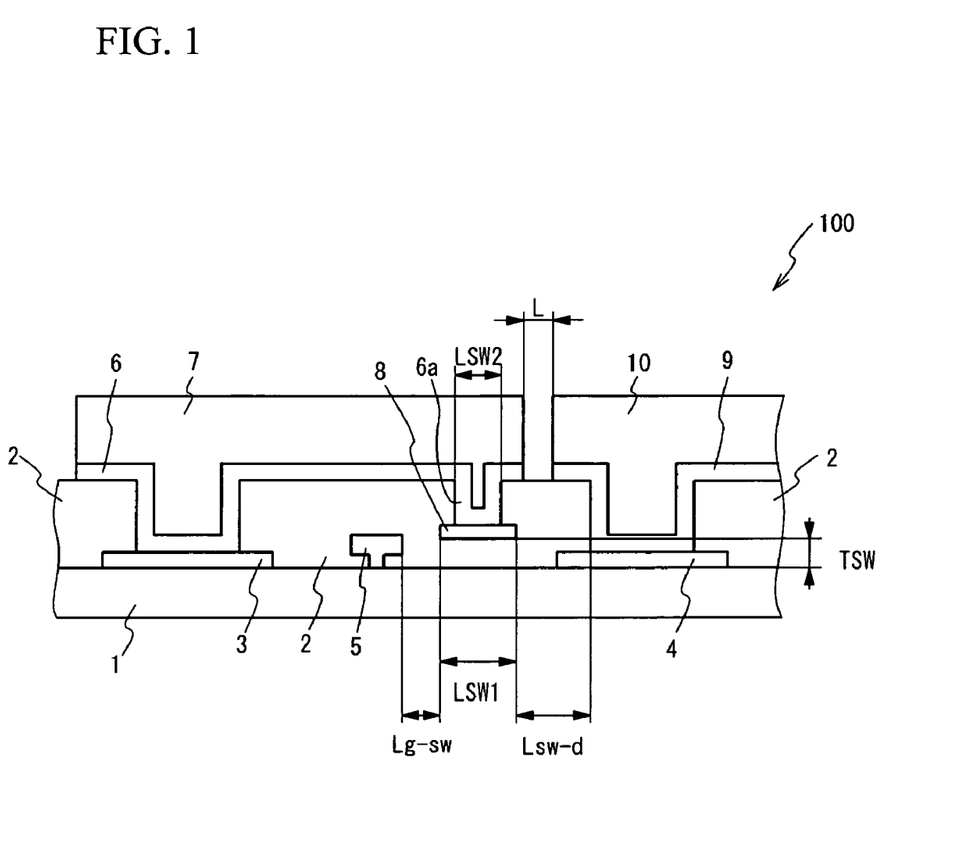
FIG. 1 is a schematic cross-sectional view of a semiconductor device in accordance with a first embodiment of the present invention.

FIG. 1 is a schematic cross-sectional view of a semiconductor device 100 in accordance with a first embodiment of the present invention (GaN-HEMT). As shown in FIG. 1, the semiconductor device 100 includes a semiconductor layer 1 formed on a semiconductor substrate, an insulating layer 2, a source electrode 3, a drain electrode 4, a gate electrode 5, a source wall 6, Au wires 7 and 10, an electrode portion 8, and a barrier metal 9.

The semiconductor substrate is formed with a Si-, GaAs-, or GaN-based semiconductor. Instead of the semiconductor substrate, a sapphire or SiC substrate may be used. The gate electrode 5 is formed on the semiconductor layer 1 on the semiconductor substrate. The source electrode 3 and the drain electrode 4 are formed on the semiconductor layer 1, so as to interpose the gate electrode 5. The Au wire 7 is formed over the source wall 6.

The source wall 6 and the Au wire 7 extend through the regions above the source electrode 3 and the gate electrode 5, ending at the mid point between the gate electrode 5 and the drain electrode 4. The source wall 6 is made of a barrier metal. The source wall 6 protrudes in relation to the semiconductor layer 1 in the vicinity of an edge portion. The protruding portion will be hereinafter referred to as convex portion 6a. The electrode portion 8 is provided at the end of the convex portion 6a. The convex portion 6a functions as the joint portion between the source wall 6 and the electrode portion 8. The electrode portion 8 extends toward one or both of the gate electrode 5 and the drain electrode 4. The electrode portion 8 is made of an alloy such as Ni/Au, Ti/Au, or Ti/Pt.

The insulating layer 2 is provided between the source wall 6 and the gate electrode 5. The insulating layer 2 may be formed with an inorganic insulating material such as SiN, $SiO_2$, or SiON, or an organic insulating material such as polyimide, resist, or benzocyclobutene. Although the insulating layer 2 may be made of any of the above materials, a SiN film is preferred for the insulating layer 2 in terms of controllability and workability in processing. The barrier metal 9 is provided on the drain electrode 4. The Au wire 10 is formed over the barrier metal 9.

In the semiconductor device 100 in accordance with this embodiment, the source wall 6 and the Au wire 7 extend through the regions above the source electrode 3 and the gate electrode 5, ending at the mid point between the gate electrode 5 and the drain electrode 4. Accordingly, the electric field concentration is reduced in the vicinity of the gate electrode 5 and the drain electrode 4. Thus, the parasitic capacitance Cgd between the gate and the drain can be reduced in the semiconductor device 100. Also, since the electrode portion 8 extends toward one or both of the gate electrode 5 and the drain electrode 4, the current collapse is restrained, and the voltage withstanding capability can be increased. Further, since the electrode portion 8 made of an alloy extends toward one or both of the gate electrode 5 and the drain electrode 4, the strength of the source wall 6 can be increased where a space is formed by etching at least a part of the region between the gate electrode 5 and the source wall 6. Also, as the contact area between the source wall 6 and the insulating layer 2 is large, the adherence of the insulating layer 2 to the source wall 6 can be increased.

The thickness of the insulating layer 2 is preferably 600 nm or more. In this case, the moisture in the air is prevented from reaching the semiconductor layer. Thus, the moisture resistance of the semiconductor device 100 is increased.

In the following, the electrode portion 8 is described in detail. The width of the electrode portion 8 between the gate and the drain is represented by LSW1, the width of the contact portion between the electrode portion 8 and the convex portion 6a is LSW2, the distance between the electrode portion 8 and the semiconductor layer 1 is TSW, the distance between the electrode portion 8 and the gate electrode 5 in the direction of the substrate face of the semiconductor layer 1 is Lg-sw, the distance between the electrode portion 8 and the drain electrode 4 is Lsw-d, and the distance between the Au wire 7 and the Au wire 10 is L. Also, the parasitic capacitance between the gate and the source is represented by Cgs, and the parasitic capacitance between the drain and the source is Cds.

Figure 2A:
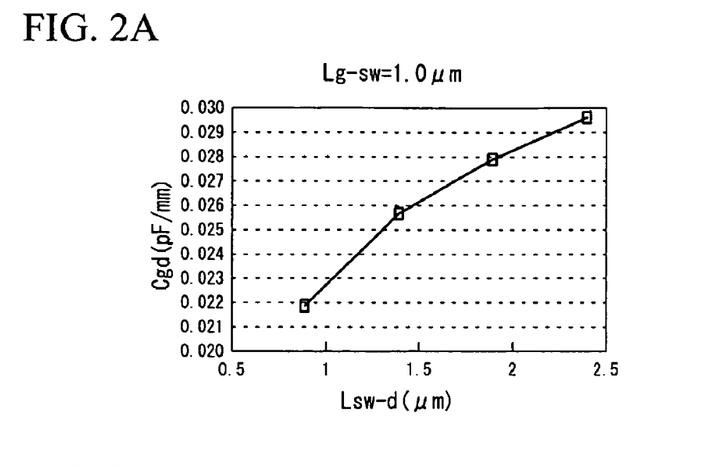
FIGS. 2A through 2C illustrate the characteristics of the semiconductor device.
Figure 2B:
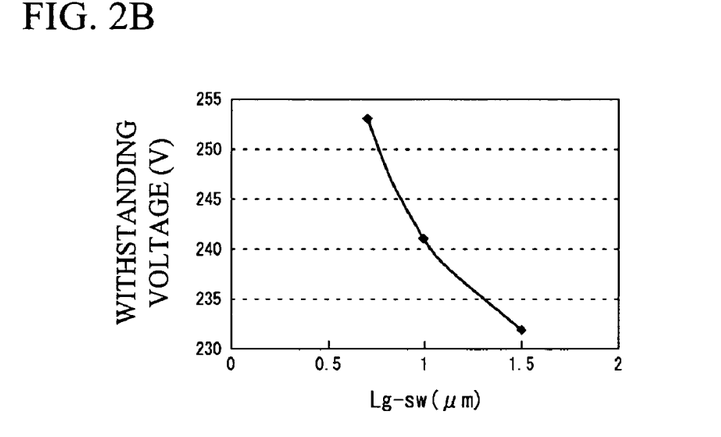
Figure 2C:
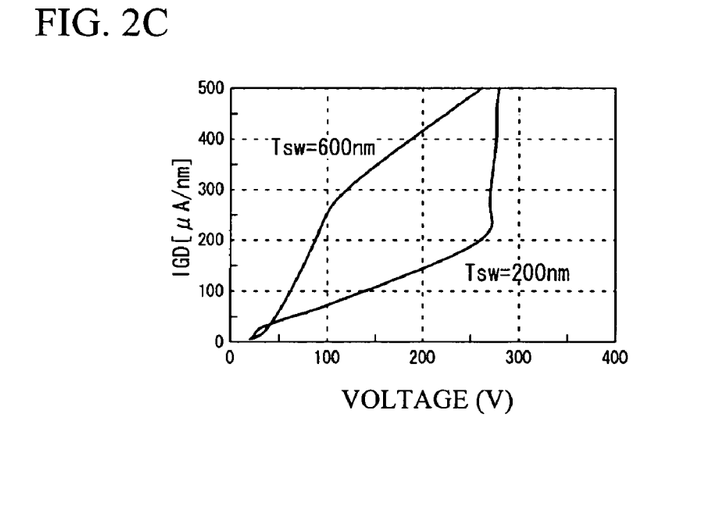

FIGS. 2A through 2C illustrate the characteristics of the semiconductor device 100. FIG. 2A shows the relationship between the distance Lsw-d and the capacitance Cgd where the distance Lg-sw is 1.0 μm. In FIG. 2A, the ordinate axis indicates the capacitance Cgd, and the abscissa axis indicates the distance Lsw-d. As shown in FIG. 2A, the capacitance Cgd decreases as the distance Lsw-d becomes shorter. Therefore, it is preferable to minimize the distance Lsw-d.

Since the electrode portion 8 extends toward the drain electrode 4, the line of electric force between the gate electrode 5 and the drain electrode 4 might be cut off, so as to reduce the capacitance Cgd. Further, the distance between the end of the source wall 6 and the drain electrode 4 is preferably long, so that the capacitance between the source wall 6 and the drain electrode 4 can be reduced. The distance between the end of the source wall 6 and the drain electrode 4 is preferably longer than the distance between the electrode portion 8 and the drain electrode 4. In a case where the electrode portion 8 extends toward the gate electrode 5, the voltage withstanding capability can be increased. Further, the capacitance between the convex portion 6a of the source wall 6 and the gate electrode 5 can be reduced. For example, the distance Lsw-d is preferably 1 μm to 2.5 μm.

FIG. 2B shows the relationship between the distance Lg-sw and the voltage withstanding capability between the gate and the drain. In FIG. 2B, the ordinate axis indicates the gate-drain voltage withstanding capability, and the abscissa axis indicates the distance Lg-sw. As shown in FIG. 2B, the date-drain voltage withstanding capability increases as the distance Lg-sw becomes shorter. Therefore, it is preferable to minimize the distance Lg-sw.

As can be seen from the above facts, the width LSW1 is made 2 μm to 4 μm, so as to reduce the capacitance Cgd while restraining an increase in capacitance Cds. Therefore, the width LSW1 is preferably 2 μm to 4 μm. The thickness of the electrode portion 8 is preferably 100 nm to 300 nm. The width LSW1 is preferably larger than the width LSW2.

This is because, if the width LSW1 and the width LSW2 are the same, the capacitance Cgs and the capacitance Cds increase.

FIG. 2C shows the relationship between the gate-drain voltage withstanding capability and gate leak current IGD where the distance TSW is varied. In FIG. 2C, the ordinate axis indicate the gate leak current IGD, and the abscissa axis indicates the gate-drain voltage. As shown in FIG. 2C, the gate leak current IGD increases as the gate-drain voltage increase. In a case where the distance TSW is 200 nm, however, the increase in gate leak current IGD is restrained until the gate-drain voltage reaches a predetermined value. Accordingly, the distance TSW is preferably in the neighborhood of 200 nm. Meanwhile, the lower face of the electrode portion 8 is preferably located closer to the semiconductor layer 1 than the upper face of the gate electrode 5 to the semiconductor layer 1 (for example, the distance between the lower face of the electrode portion 8 and the semiconductor layer 1 being 400 nm). In this case, the capacitance Cgd can be reduced.

Although the distance TSW is shown as 200 nm in FIG. 2C, the same data as those obtained with the distance TSW of 200 nm can be obtained where the distance TSW is in the range of 100 nm to 300 nm. Also, where the distance TSW is 600 nm or longer, the same data as those obtained with the distance TSW of 600 nm can be obtained.

Figure 3A:
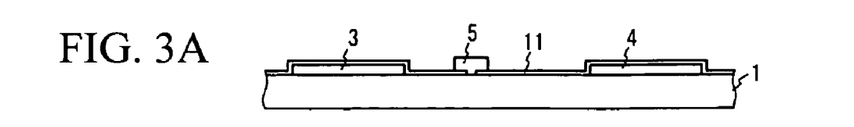
FIGS. 3A through 3G illustrate a manufacturing flow in accordance with a method of manufacturing the semiconductor device.

In the following, a method of manufacturing the semiconductor device 100 shown in FIG. 1 is described. FIGS. 3A through 3G illustrate a manufacturing flow in accordance with the method of manufacturing the semiconductor device 100. As shown in FIG. 3A, a bulk of the semiconductor device 100 is prepared. This bulk has a structure in which the source electrode 3, the drain electrode 4, and the gate electrode 5 are formed on the semiconductor layer 1, and the source electrode 3 and the drain electrode 4 are covered with an insulating layer 11. The source electrode 3 and the drain electrode 4 interpose the gate electrode 5. The insulating layer 11 is formed with an inorganic insulating material such as SiN, $SiO_2$, or SiON, or an organic insulating material such as polyimide, resist, or benzocyclobutene. The insulating layer 11 may be formed by plasma CVD.

Figure 3B:
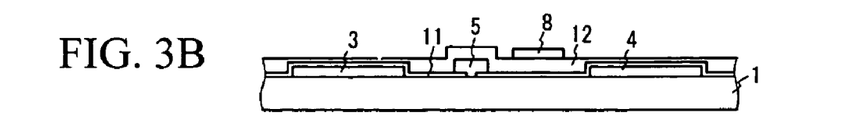

As shown in FIG. 3B, an interlayer film 12 is formed by CVD, so as to cover the insulating layer 11 and the gate electrode 5. The thickness of the interlayer film 12 is approximately 200 nm, for example. The interlayer film 112 is formed with an inorganic insulating material such as SiN, $SiO_2$, or SiON, or an organic insulating material such as polyimide, resist, or benzocyclobutene. After a resist pattern is formed, the electrode portion 8 is formed on the portion of the interlayer film between the gate electrode 5 and the drain electrode 4 by vacuum vapor deposition. The electrode portion 8 is made of an alloy such as Ni/Au. The thickness of the electrode portion 8 is approximately 100 nm, for example, and the width LSW1 of the electrode portion 8 is approximately 3 µm, for example.

Figure 3C:
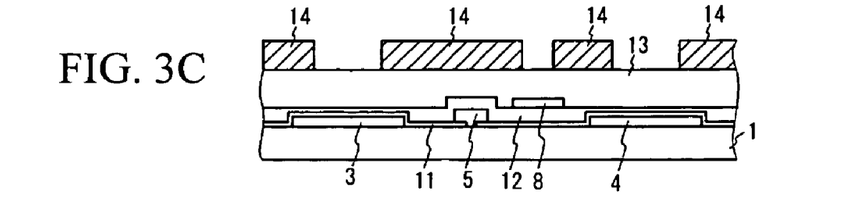

As shown in FIG. 3C, an interlayer film 13 is then formed by plasma CVD, so as to cover the interlayer film 12 and the electrode portion 8. The thickness of the interlayer film 13 is approximately 600 nm, for example. The interlayer film 13 is formed with an inorganic insulating material such as SiN, $SiO_2$, or SiON, or an organic insulating material such as polyimide, resist, or benzocyclobutene. A resist pattern 14 is then formed on the interlayer film 13. The resist pattern 14 can be prepared by applying resist onto the interlayer film 13 and removing the resist from the upper faces of the source electrode 3, the electrode portion 8, and the drain electrode 4 by patterning.

Figure 3D:
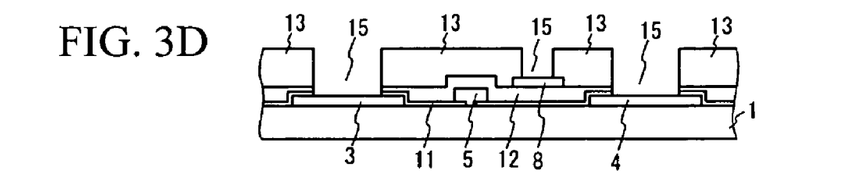

As shown in FIG. 3D, etching is performed on the interlayer films 13 and 12 and the insulating layer 11, so as to form contact holes 15. The resist pattern 14 is then removed.

Figure 3E:
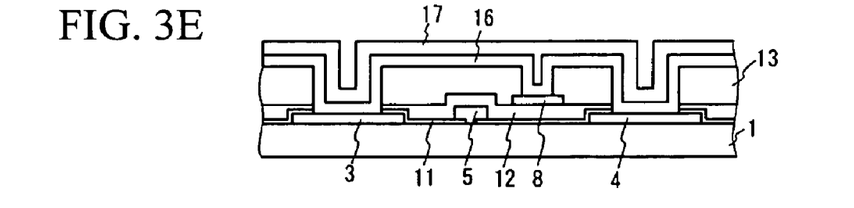

As shown in FIG. 3E, a barrier metal film 16 and an Au wire film 17 (seed metal for plating) are formed in this order by vacuum vapor deposition or sputtering, so as to cover the interlayer film 13, the source electrode 3, the electrode portion 8, and the drain electrode 4. The thickness of the barrier metal film 16 is approximately 350 nm.

Figure 3F:
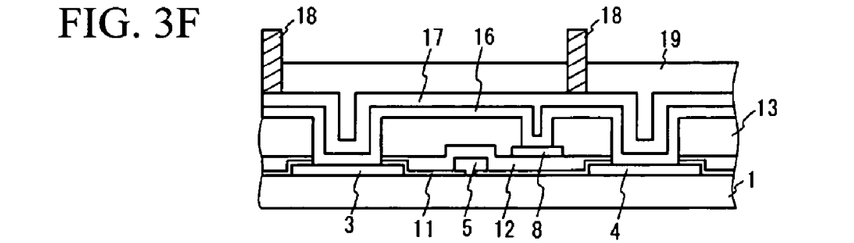

As shown in FIG. 3F, a resist pattern 18 is formed on the portion of the Au wire film 17 between the electrode portion 8 and the drain electrode 4. An Au wire 19 is then formed on the Au wire film 17 by plating. The thickness of the Au wire 19 is approximately 3 µm, for example.

Figure 3G:
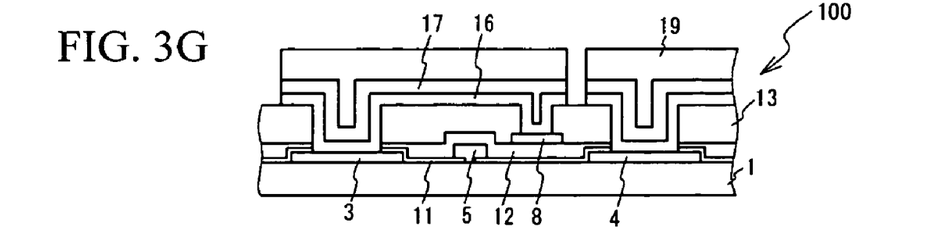

As shown in FIG. 3G, the resist pattern 18 is removed. Milling is then performed on the portions of the Au wire film 17 from which the resist pattern 18 has been removed. Etching is performed on the portions of the barrier metal film 16 from which the resist pattern 18 has been removed. As a result, the barrier metal film 16 and the Au wire film 17 are separated from each other. Through the above procedures, the semiconductor device 100 is completed. Other than the milling process, RIE, ECR, or ICP may be performed, for example.

The interlayer films 13 and 12 and the insulating layer 11 are equivalent to the insulating layer 2 shown in FIG. 1. The barrier metal film 16 is equivalent to the source wall 6 and the barrier metal 9 shown in FIG. 1. The Au wire film 17 and the Au wire 19 are equivalent to the Au wires 7 and 10 shown in FIG. 1.

Figure 4:
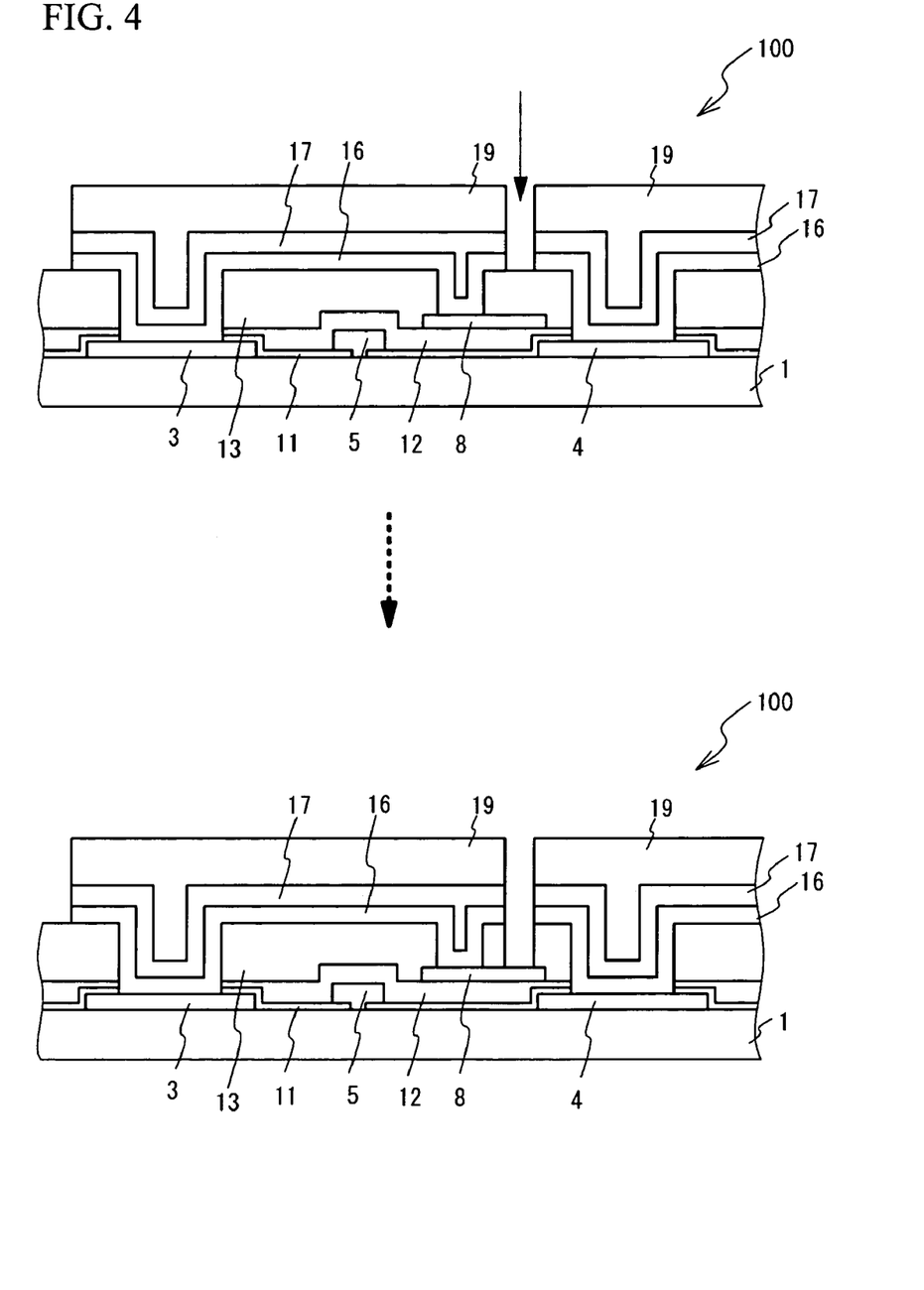
FIG. 4 illustrates another example of a method of manufacturing the semiconductor device.

Also, as shown in FIG. 4, the etching illustrated in FIG. 3G may reach the electrode portion 8. In such a case, the electrode portion 8 functions as an etching stopper. Accordingly, etching is prevented from reaching the semiconductor layer 1, even though the etching time is not adjusted. The etching in this case is either dry etching or wet etching.

Figure 5A:
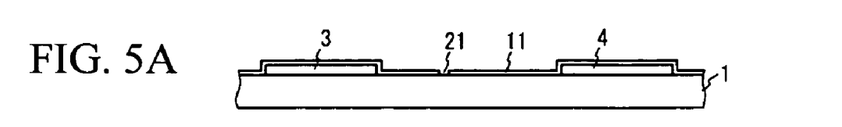
FIGS. 5A through 5G illustrate a manufacturing flow in accordance with yet another example of a method of manufacturing the semiconductor device.

FIGS. 5A through 5G illustrate a manufacturing flow in accordance with another example of a method of manufacturing the semiconductor device 100. By this method, the gate electrode 5 and the electrode portion 8 can be formed in one step. Accordingly, the manufacturing process can be simplified, and the production cost can be lowered, compared with the method illustrated in FIGS. 3A through 3G. As shown in FIG. 5A, an insulating layer 11 is first formed by plasma CVD, so as to cover the source electrode 3 and the drain electrode 4, which are formed on the semiconductor layer 1. The insulating layer 11 is formed with an inorganic insulating material such as SiN, $SiO_2$, or SiON, or an organic insulating material such as polyimide, resist, or benzocyclobutene. A contact hole 21 is then formed between the source electrode 3 and the drain electrode 4 by dry etching or the like.

Figure 5B:
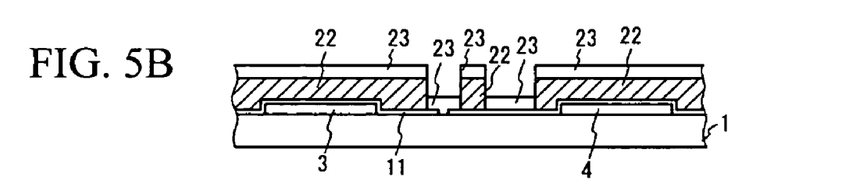

As shown in FIG. 5B, a resist pattern 22 is then formed on the insulating layer 11. The resist pattern 22 can be prepared by applying resist onto the entire insulating layer 11, removing the resist from the contact hole 21, and also removing the resist from the portion between the contact hole 21 and the drain electrode 4. A metal layer 23 is then formed on the resist pattern 22 and the insulating layer 11 by vacuum vapor deposition, sputtering, or the like. The metal layer 23 is made of an alloy such as Ni/Au. The thickness of the metal layer 23 is approximately 100 nm, for example.

Figure 5C:
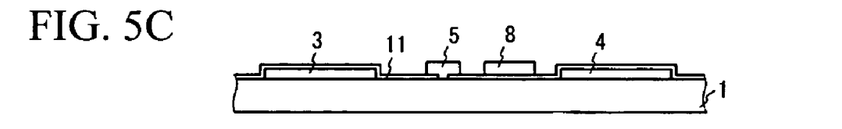

As shown in FIG. 5C, the resist pattern 22 is then removed by lift-off. By doing so, the gate electrode 5 is formed in the surrounding area of the contact hole 21, and a second source electrode 8 is formed between the gate electrode 5 and the drain electrode 4.

Figure 5D:
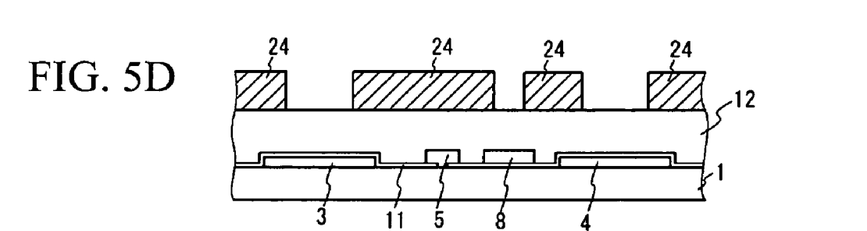

As shown in FIG. 5D, an interlayer film 12 is formed by plasma CVD, so as to cover the insulating layer 11, the gate electrode 5, and the electrode portion 8. The thickness of the interlayer film 12 is approximately 600 nm, for example. A resist pattern 24 is then formed on the interlayer film 12. The resist pattern 24 can be prepared by applying resist onto the interlayer film 12 and removing the resist from the top faces of the source electrode 3, the electrode portion 8, and the drain electrode 4 by patterning.

Figure 5E:
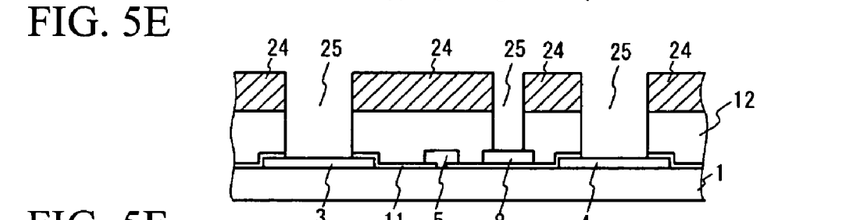
Figure 5F:
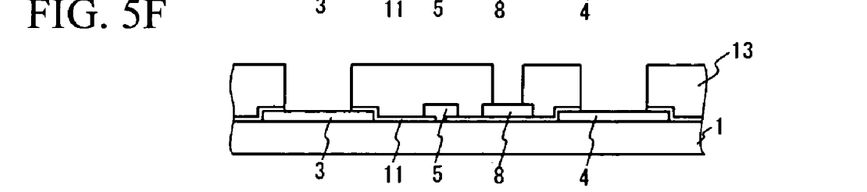
Figure 5G:
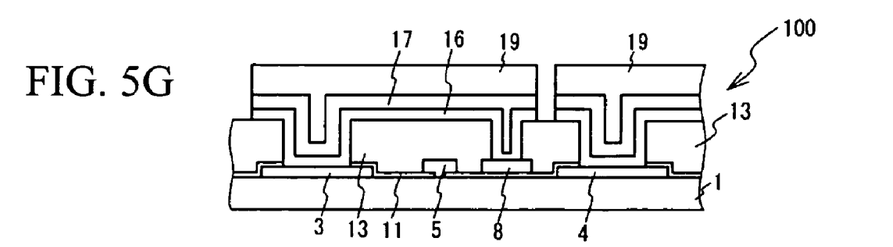

As shown in FIG. 5E, etching is then performed on the interlayer film 12 and the insulating layer 11, so as to form contact holes 25. As shown in FIG. 5F, the resist pattern 24 is removed. The same procedures as those illustrated in FIGS. 3E through 3G are then carried out, thereby completing the semiconductor device 100, as shown in FIG. 5G.

Second Embodiment

Figure 6:
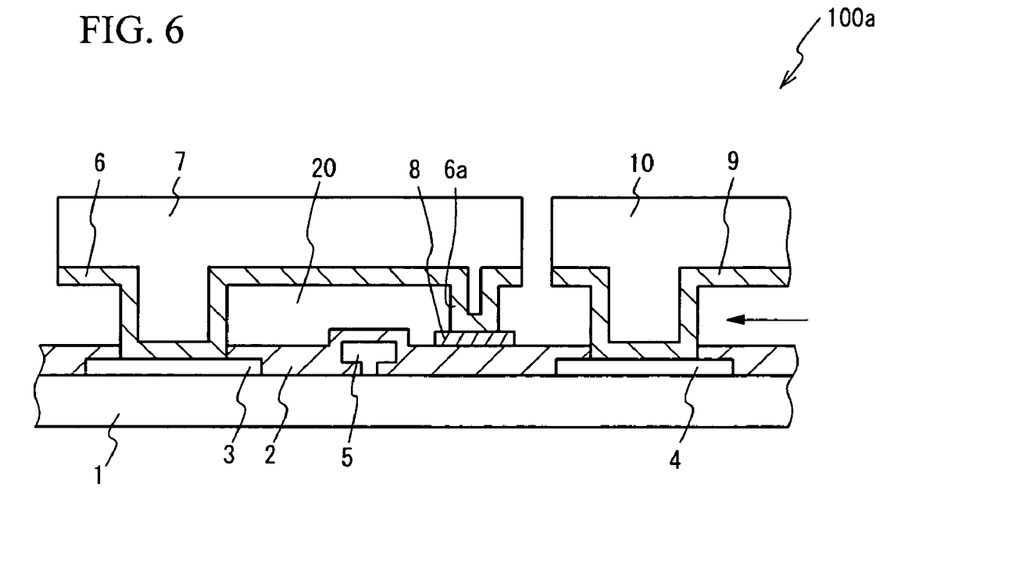
FIG. 6 is a schematic cross-sectional view of a semiconductor device in accordance with a second embodiment of the present invention.

FIG. 6 is a schematic cross-sectional view of a semiconductor device 100a (GaN-HEMT) in accordance with a second embodiment of the present invention. The semiconductor device 100a differs from the semiconductor device 100 of FIG. 1 in that a space is formed between the insulating layer 2 and the source wall 6. In this embodiment, the capacitance Cds can be reduced. In the semiconductor device 100a, an organic interlayer film made of polyimide, resist, or the like, is employed as the interlayer film 13 shown in FIGS. 3C through 3G. The semiconductor device 100a is completed by performing wet etching or oxygen dry etching on the interlayer film 13 after the semiconductor 100 shown in FIG. 3G is formed. Also, the source wall 6 may be an air bridge.

Third Embodiment

Figure 7:
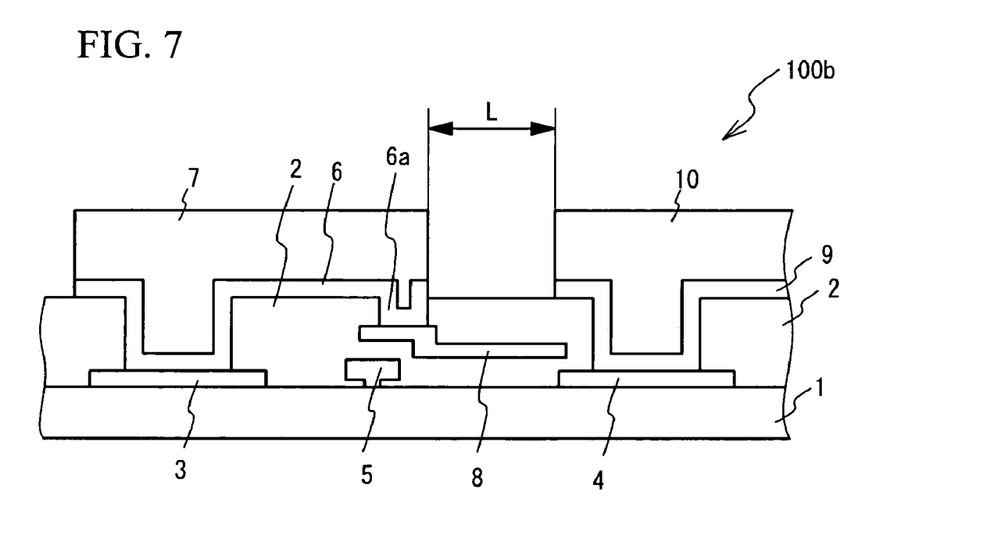
FIG. 7 is a schematic cross-sectional view of a third embodiment of the present invention.

FIG. 7 is a schematic cross-sectional view of a semiconductor device 100b (GaN-HEMT) in accordance with a third embodiment of the present invention. The semiconductor device 100b differs from the semiconductor device 100 of FIG. 1 in that the source wall 6 and the Au wire 7 extend above the gate electrode 5.

In this embodiment, in the region above the gate electrode 5, the source wall 6 and the Au wire 7 are located closer to the gate electrode 5 than to the drain electrode 4. Accordingly, the distance L becomes as long as 3 μm to 5 μm, for example. Thus, the capacitance Cds is reduced in the semiconductor device 100b of this embodiment.

The above described effect can be achieved, provided that the source wall 6 extends from the source electrode 3 at least to a point between the source electrode 3 and the gate electrode 5, and the electrode portion 8 extends from the convex portion 6a of the source wall 6 to a point between the gate electrode 5 and the drain electrode 4.

In the semiconductor device 100b of this embodiment, the distance between the end of the source wall 6 and the drain electrode 4 is also preferably longer than the distance between the electrode portion 8 and the drain electrode 4. This is because, with this arrangement, the capacitance between the source wall 6 and the drain electrode 4 can be reduced. Further, a space may also be formed between the insulating layer 2 and the source wall 6, so as to reduce the capacitance Cds.

Figure 8A:
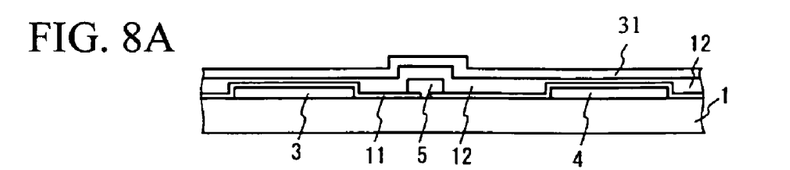
FIGS. 8A through 8F illustrate a manufacturing flow in accordance with a method of manufacturing the semiconductor device.

FIGS. 8A through 8F illustrate a manufacturing flow in accordance with a method of manufacturing the semiconductor device 100b. First, the same bulk as that of FIG. 3A is prepared, as shown in FIG. 8A. An interlayer film 12 is then formed by plasma CVD, so as to cover an insulating layer 11 and the gate electrode 5. Further, a metal layer 31 is formed on the interlayer film 12 by vacuum vapor deposition, sputtering, or the like. The metal layer 31 is formed with an alloy such as Ni/Au having a film thickness of approximately 100 nm to 300 nm, for example.

Figure 8B:
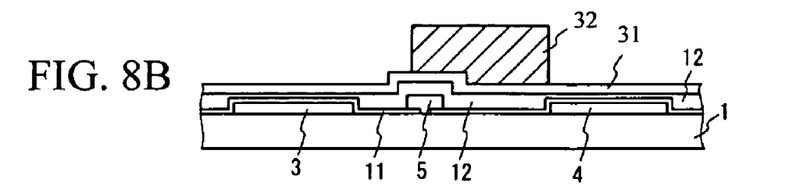

A resist pattern 32 is then formed on the metal layer 31, as shown in FIG. 8B. The resist pattern 32 can be prepared by applying resist onto the metal layer 31 and leaving the resist in the region extending from the top face of the gate electrode 5 to the top face of the drain electrode 4.

Figure 8C:
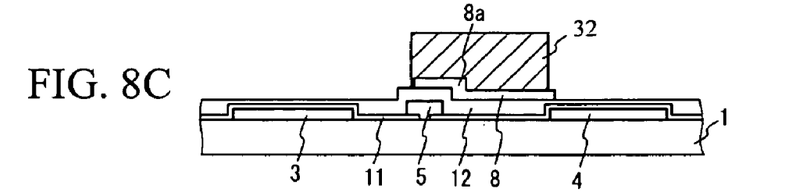

Milling is then performed on the portions of the metal layer 31 from which the resist pattern 32 has been removed. Thus, the electrode portion 8 is formed. The resist pattern 32 is then removed. Since the electrode portion 8 extends from the top of the gate electrode 5 to the top of the drain electrode 4, a step portion (hereinafter referred to as edge portion 8a) is formed in the electrode portion 8.

Figure 8D:
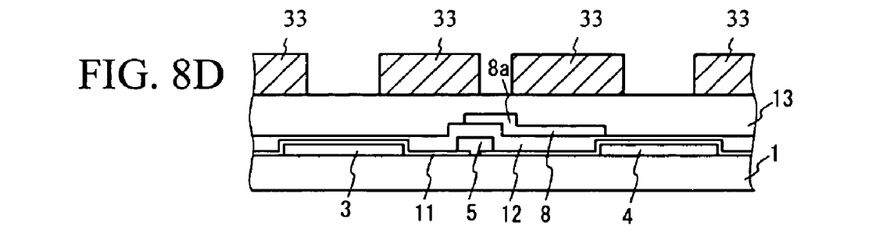

An interlayer film 13 and a resist pattern 33 are then formed on the interlayer film 12 and the electrode portion 8, as shown in FIG. 8D. The interlayer film 13 is made of an insulating material such as SiN, and can be formed by plasma CVD. The resist pattern 33 can be prepared by applying resist onto the interlayer film 13 and removing the resist from the top faces of the source electrode 3, the electrode portion 8, and the drain electrode 4 by patterning. The removal of the resist from the top of the electrode portion 8 starts from the edge of the electrode portion on the side of the source electrode 3 and ends before reaching the side of the edge portion 8a from the source electrode 3.

Figure 8E:
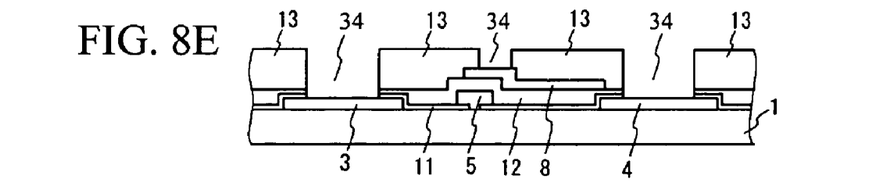

Etching is then performed on the interlayer films 13 and 12 and the insulating layer 11, so as to form contact holes 34, as shown in FIG. 8E. The resist pattern 33 is then removed.

Figure 8F:
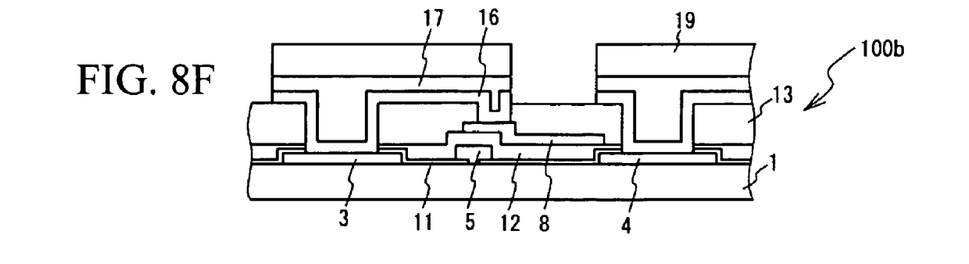

The same procedures as those illustrated in FIGS. 3E through 3G are then carried out, thereby completing the semiconductor device 100b, as shown in FIG. 8F. The electrode portion 8 may also be prepared by forming a resist pattern in the other regions than the region in which the electrode portion 8 is to be formed, depositing a metal layer on the interlayer film 12, and removing the resist pattern by lift-off.

In the semiconductor device 100b illustrated in FIGS. 8A through 8F, the edge portion 8a can be formed by vacuum vapor deposition or sputtering. Accordingly, the edge portion 8a can be made thinner than an edge portion formed by plating. In the case of plating, a certain width is required, restricting the formation of the edge portion 8a. In this embodiment, the distance between the edge portion 8a and the drain electrode 4 can be made longer, so that the capacitance can be reduced. The present invention can be applied not only to GaN-HEMTs, but also to GaN-MESFETs, GaAs-MESFETs, GaAs-HEMTs, Si-LDMOSs, and the likes.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:
1. A semiconductor device comprising:
    a gate electrode that is provided on a semiconductor layer;
    a source electrode and a drain electrode that are provided on the semiconductor layer so as to interpose the gate electrode;

a source wall that extends from the source electrode to a point between the gate electrode and the drain electrode through a region above the gate electrode, the source wall having a joining portion in the extending region; and an electrode portion that is joined to the joining portion and has a region extending closer to the drain electrode than the joining portion.

2. The semiconductor device as claimed in claim 1, wherein the distance between the drain electrode and an end of the source wall on the drain side is longer than the distance between the electrode portion and the drain electrode.

3. The semiconductor device as claimed in claim 1, wherein the electrode portion has a region extending from the joining portion toward the gate electrode.

4. The semiconductor device as claimed in claim 1, wherein:

a space is provided below the source wall; and an insulating layer is provided below the electrode portion.

5. A semiconductor device comprising:

a gate electrode that is provided on a semiconductor layer;

a source electrode and a drain electrode that are provided on the semiconductor layer so as to interpose the gate electrode;

a source wall that extends from the source electrode to a point between the gate electrode and the drain electrode through a region above the gate electrode, the source wall having a joining portion in the extending region; and an electrode portion that is provided between the gate electrode and the drain electrode, and has a region extending closer to the source electrode than the joining portion, the electrode portion being joined to the joining portion.

6. The semiconductor device as claimed in claim 5, wherein the distance between a bottom portion of the electrode portion and a surface of the semiconductor layer is 100 nm to 300 nm.

7. The semiconductor device as claimed in claim 5, wherein a bottom face of the electrode portion is located closer to the semiconductor layer than a top face of the gate electrode.

8. The semiconductor device as claimed in claim 5, wherein at least a part of the source wall is an air bridge.

9. A semiconductor device comprising:

a gate electrode that is provided on a semiconductor layer;

a source electrode and a drain electrode that are provided on the semiconductor layer so as to interpose the gate electrode;

a source wall that extends from the source electrode at least to a point between the source electrode and the gate electrode, and has a joining portion in the extending region; and an electrode portion that is joined to the joining portion and connects a region between the source electrode and the gate electrode to a region between the gate electrode and the drain electrode.

10. The semiconductor device as claimed in claim 9, wherein the distance between the drain electrode and an end of the source wall on the drain side is longer than the distance between the electrode portion and the drain electrode.

11. The semiconductor device as claimed in claim 9, wherein:

a space is provided below the source wall; and an insulating layer is provided below the electrode portion.

12. The semiconductor device as claimed in claim 9, wherein the electrode portion is formed with a metal layer that covers a surface of the insulating layer covering the gate electrode.

* * * * *